(12) United States Patent
Worones

(10) Patent No.: US 8,013,594 B2
(45) Date of Patent: Sep. 6, 2011

(54) DIGITAL MULTIMETER HAVING HINGED SHIELD ARRANGEMENT

(75) Inventor: Jeffrey E. Worones, Seattle, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 11/977,078

(22) Filed: Oct. 23, 2007

(65) Prior Publication Data

US 2009/0102455 A1    Apr. 23, 2009

(51) Int. Cl.
*G01R 1/38* (2006.01)
*G01R 11/57* (2006.01)
*G01R 15/00* (2006.01)
*G01R 15/08* (2006.01)

(52) U.S. Cl. .................................................. 324/115
(58) Field of Classification Search ................ 324/99 D, 324/115, 156
See application file for complete search history.

(56) References Cited

U.S. PATENT DOCUMENTS

| | | | | |
|---|---|---|---|---|
| 5,473,507 A * | 12/1995 | Schwegler et al. | ........... | 361/690 |
| 5,621,311 A * | 4/1997 | Kamiya | ........................ | 324/156 |
| 5,731,964 A | 3/1998 | Kitakubo et al. | | |
| 6,137,051 A | 10/2000 | Bundza | | |
| 6,570,755 B2 * | 5/2003 | Curlee et al. | .................. | 361/683 |
| 6,882,528 B2 * | 4/2005 | Chuang | ......................... | 361/685 |
| 7,286,360 B2 | 10/2007 | Sohn | | |
| 2002/0044819 A1 * | 4/2002 | Shamoon | ....................... | 402/73 |
| 2004/0048077 A1 | 3/2004 | Gabower | | |

FOREIGN PATENT DOCUMENTS

| | | |
|---|---|---|
| DE | 2928558 A1 | 7/1979 |
| EP | 0619697 | 10/1994 |
| GB | 1324560 | 7/1973 |
| JP | 10290092 | 10/1998 |
| WO | 9633599 | 10/1996 |
| WO | 2004107374 | 12/2004 |
| WO | 2007133628 | 11/2007 |

OTHER PUBLICATIONS

U.K. Intellectual Property Office Search Report dated Jul. 18, 2008 for corresponding application filed in the U.K.
Pending U.S. Appl. No. 11/893,109, filed Oct. 23, 2007.
Pending U.S. Appl. No. 11/893,093, filed Aug. 14, 2007.
Pending U.S. Appl. No. 11/893,092, filed Aug. 14, 2007.
Pending U.S. Appl. No. 11/893,122, filed Aug. 14, 2007.
Supplement to Information Disclosure Statement filed with the U.S. Patent and Trademark Office on Mar. 3, 2011.
Office Action issued by German Patent Office on Mar. 11, 2011 regarding corresponding German application with attached English Translation.

* cited by examiner

*Primary Examiner* — Roberto Velez
(74) *Attorney, Agent, or Firm* — Nelson Mullins Riley & Scarborough, LLP

(57) ABSTRACT

A multimeter comprises a case having a circuit board located therein. The circuit board has a top side and a bottom side. A shield arrangement is configured to cover at least a portion of the top side and the bottom side of the circuit board. The shield arrangement includes a top shield part adjacent to the top side of the circuit board and a bottom shield part adjacent to the bottom side of the circuit board. The shield arrangement also includes a connecting structure by which the top shield part is interconnected with the bottom shield part. The connecting structure preferably forms at least one hinge configured such that the top shield part and the bottom shield part can be moved between open and closed configurations. Often, a plurality of hinges will be provided.

24 Claims, 5 Drawing Sheets

DIGITAL MULTIMETER HAVING HINGED SHIELD ARRANGEMENT

BACKGROUND OF THE INVENTION

The present invention relates generally to digital multimeters. More particularly, the invention relates to a digital multimeter having an improved shield arrangement for the internal printed circuit board.

Digital multimeters (DMMs) function to measure a number of electrical parameters as needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary knob by which various functions are selected. A plurality of lead jacks are provided in the case (i.e., housing) of the unit for connection of test leads. The specific jack used may depend on the function that has been selected. An LCD display provides a reading of the tested parameter.

Various electronic components necessary for operation of the multimeter are typically mounted to a circuit board located inside the case. A top shield and a separate bottom shield cover portions of the top side and bottom side of the circuit board, respectively. The shields reduce the effects of interference on the operation of the multimeter.

Details regarding the construction and operation of multimeters may be discerned from U.S. Pat. Nos. 7,034,517, 6,466,003 and 6,043,640, incorporated herein by reference.

SUMMARY OF THE INVENTION

According to one aspect, the present invention provides a multimeter comprising a case having a circuit board located therein. The circuit board has a top side and a bottom side. A shield arrangement is configured to cover at least a portion of the top side and the bottom side of the circuit board. The shield arrangement includes a top shield part adjacent to the top side of the circuit board and a bottom shield part adjacent to the bottom side of the circuit board. The shield arrangement also includes a connecting structure by which the top shield part is interconnected with the bottom shield part. The connecting structure preferably forms at least one hinge configured such that the top shield part and the bottom shield part can be moved between open and closed configurations. Often, a plurality of hinges will be provided.

In exemplary embodiments, the hinge may be configured as a living hinge. For example, the top shield part, the bottom shield part and the living hinge may be unitarily formed of a conductive polymeric material. Alternatively, the top shield part and the bottom shield part may comprise a substrate of nonconductive polymeric material having a conductive coating thereon. The living hinge in such embodiments may be unitarily formed of the nonconductive polymeric material along with the substrate of the top shield part and the bottom shield part.

The shield arrangement may also include at least one aligning feature to facilitate alignment of the top shield part and the bottom shield part in the closed configuration. For example, the aligning feature may comprise a pin and hole combination.

In many embodiments, the shield arrangement may include a latch which secures the shield arrangement in the closed configuration. Often, it may be desirable to utilize a fastener extending through the circuit board to secure the top shield part, the bottom shield part and the circuit board in position with respect to each other.

In accordance with another aspect, the invention provides a subassembly for use in an electronic device. The subassembly comprises a generally planar circuit board having a plurality of electronic devices mounted thereon, the circuit board having a top side and a bottom side. A shield arrangement is configured to cover at least a portion of the top side and the bottom side of the circuit board. The shield arrangement includes a top shield part adjacent to the top side of the circuit board and a bottom shield part adjacent to the bottom side of the circuit board. The shield arrangement includes at least one hinge pivotally interconnecting the top shield part and the bottom shield part.

The subassembly also preferably includes means for securing the shield arrangement in a closed configuration fixed to the circuit board. For example, the means for maintaining may comprise a threaded fastener. The threaded fastener may extend through the circuit board to secure the top shield part, the bottom shield part and the circuit board in position with respect to each other. The means for maintaining may comprise a latch.

Another aspect of the present invention provides a method of assembling components of a digital multimeter. One step of the method involves providing a generally planar circuit board having a plurality of electronic devices mounted thereon, the circuit board having a top side and a bottom side. Also provided is a shield arrangement including a top shield part and a bottom shield part pivotally interconnected with each other via a hinge so as to be movable between an open configuration and a closed configuration.

With the shield arrangement in the open configuration, one of the top shield part and the bottom shield part is positioned adjacent to a corresponding one of the top side and the bottom side of the circuit board. The shield arrangement is pivoted to be in the closed position such that another of the top shield part and the bottom shield part will be adjacent to a corresponding one of the top side and the bottom side of the circuit board. The shield arrangement is secured to form a subassembly in which the top shield part, the bottom shield part and the circuit board are maintained in position with respect to each other. The subassembly is then placed in a multimeter case.

A still further aspect of the present invention is provided by a multimeter comprising a case having a selector knob for selecting a multimeter function and a display. A circuit board is located in the case.

The multimeter further comprises a shield arrangement configured to cover at least a portion of the circuit board. The shield arrangement includes a top shield part and a bottom shield part. At least one hinge pivotally interconnects the top shield part and the bottom shield part.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
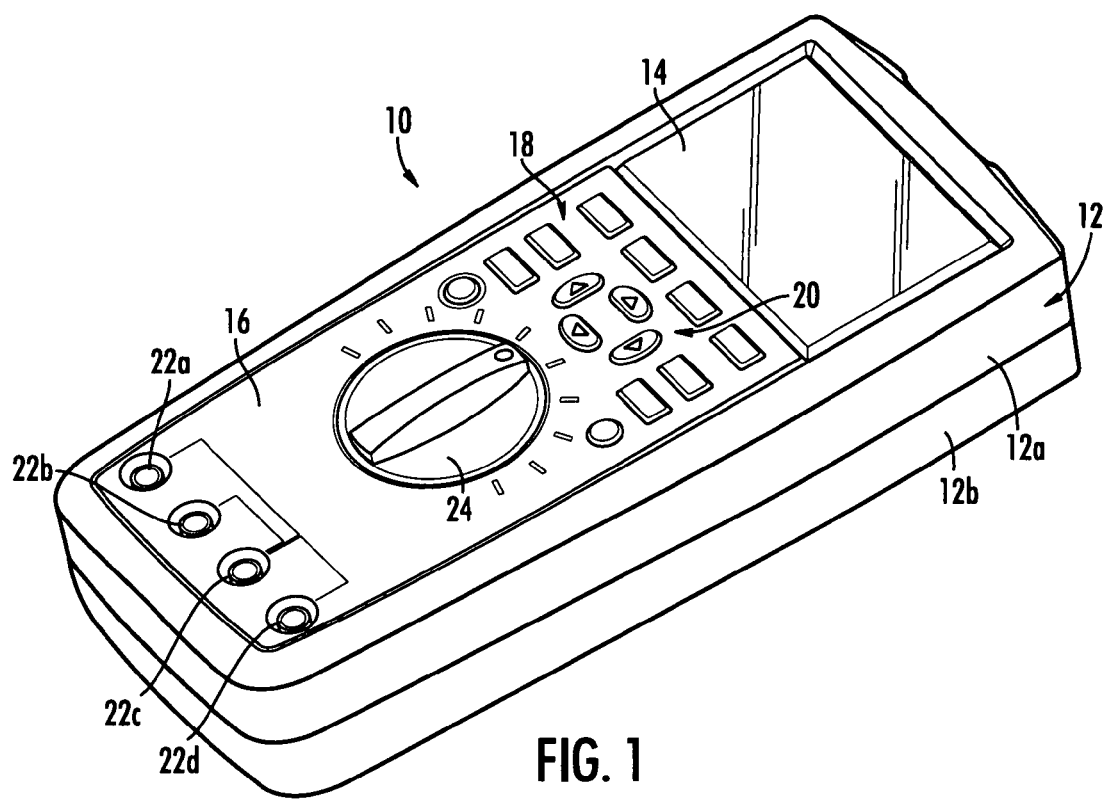
FIG. 1 is a perspective view of a digital multimeter that may utilize a shield arrangement in accordance with the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a digital multimeter (DMM) 10 constructed in accordance with the present invention. Multimeter 10 comprises a housing having a case 12 defining an interior cavity in which various internal components are located. In this embodiment, case 12 is preferably formed having top and bottom case members 12a and 12b which together define the interior cavity. Preferably, each of the case members 12a and 12b may be formed of a molded shell of high impact rigid plastic which is at least partially overmolded with a softer polymeric material. The softer material provides a desirable gripping surface.

Top case member 12a has a display 14, such as a liquid crystal display (LCD). In this embodiment, a separate front panel (or "skin") 16 is received in a corresponding recess defined in top case member 12a. Panel 16, which is preferably formed of an opaque and rigid polymeric material, defines various apertures and other features necessary for a particular multimeter model.

A plurality of keys (collectively indicated at 18) provide a user interface. As shown, these keys may include directional navigation buttons (as indicated at 20). A plurality of jacks 22a-d are also provided for connection of respective test leads. A rotary selector knob 24 allows the user to select a particular multimeter function. As one skilled in the art will appreciate, suitable graphics will typically be printed on the top surface of panel 16 to indicate the respective function.

Figure 2:
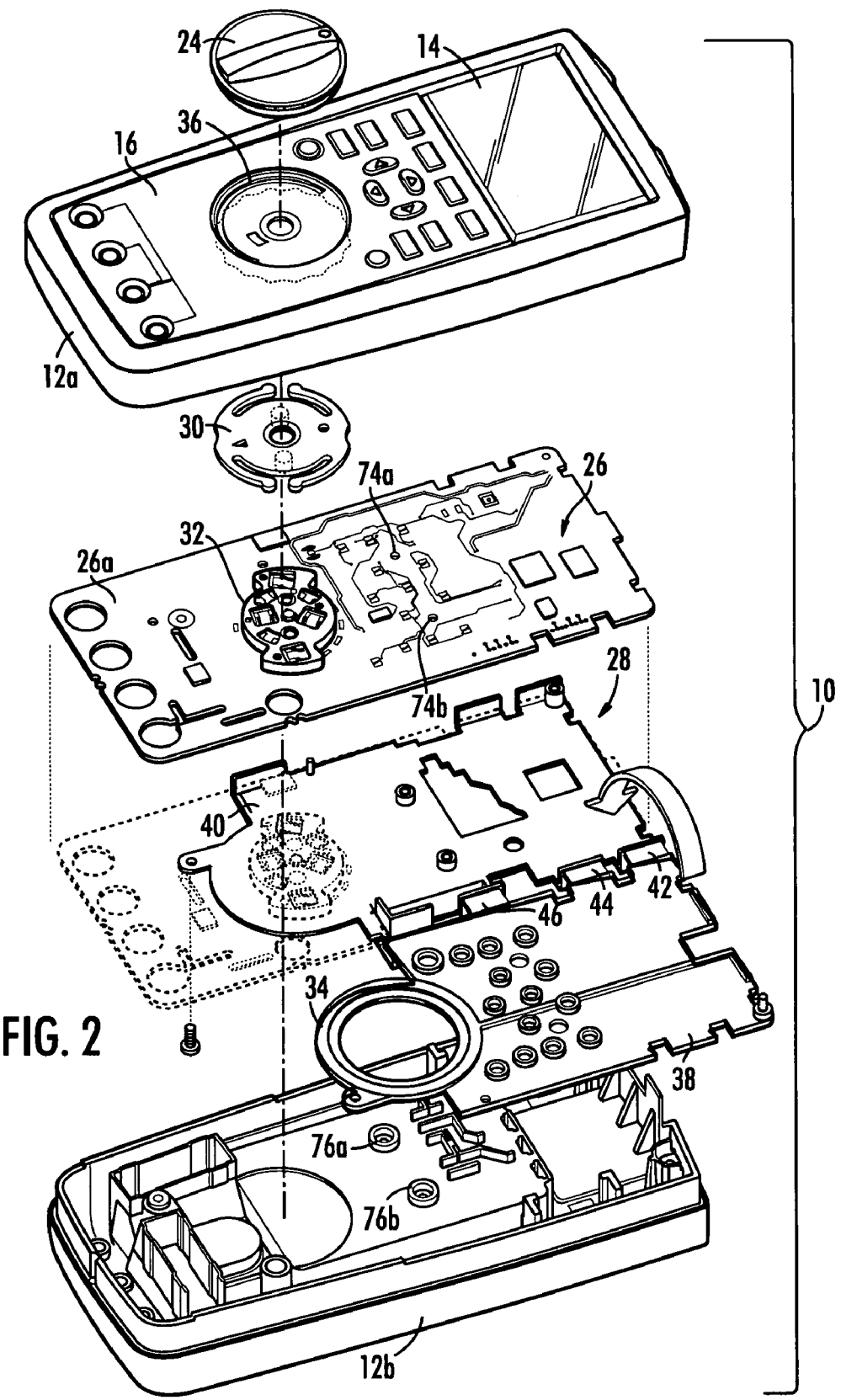
FIG. 2 is an exploded view showing various components of the multimeter of FIG. 1.
Figure 3:
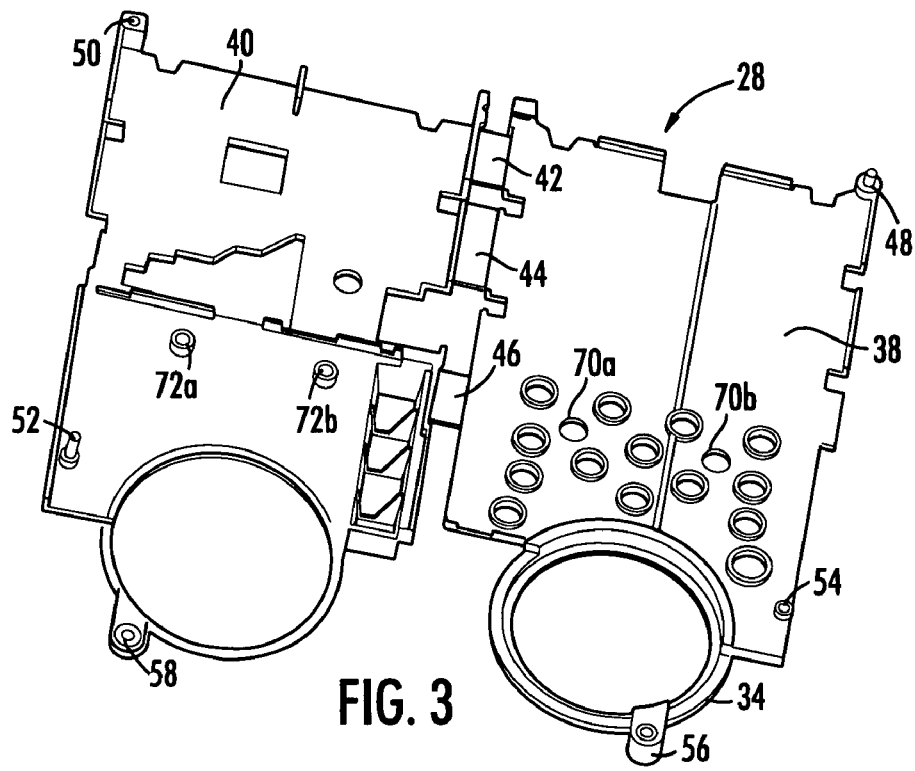
FIG. 3 is a perspective view of an embodiment of the shield arrangement in an open configuration to show inner surfaces thereof.

Certain additional details about the construction of multimeter 10 can be most easily explained with reference to FIG. 2. Various electronic devices necessary for operation of multimeter 10 are mounted to a circuit board 26 within the interior cavity of case 12. As will be explained in more detail below, portions of circuit board 26 are covered by a shield arrangement 28 to reduce the effects of interference on the operation of multimeter 10.

Preferably, a suitable detent mechanism 30 divides rotation of selector knob 24 into discrete increments. As a result, selector knob 24 will remain in the selected position until the user intentionally moves the knob to a new position. Detent mechanism 30 is in turn connected to a rotary switch member 32 located on circuit board 26. A circular portion 34 of shield arrangement 28 defines an opening that allows the desired interconnection between detent mechanism 30 and rotary switch member 32.

A stop feature is preferably provided to limit rotation of knob 24 in both clockwise and counterclockwise directions. In this embodiment, the stop feature comprises an arcuate groove 36 defined in the surface of panel 16. Groove 36 receives a protrusion located on the bottom of selector knob 24. When the protrusion engages the end faces of groove 36, further rotation is prevented.

Figure 4:
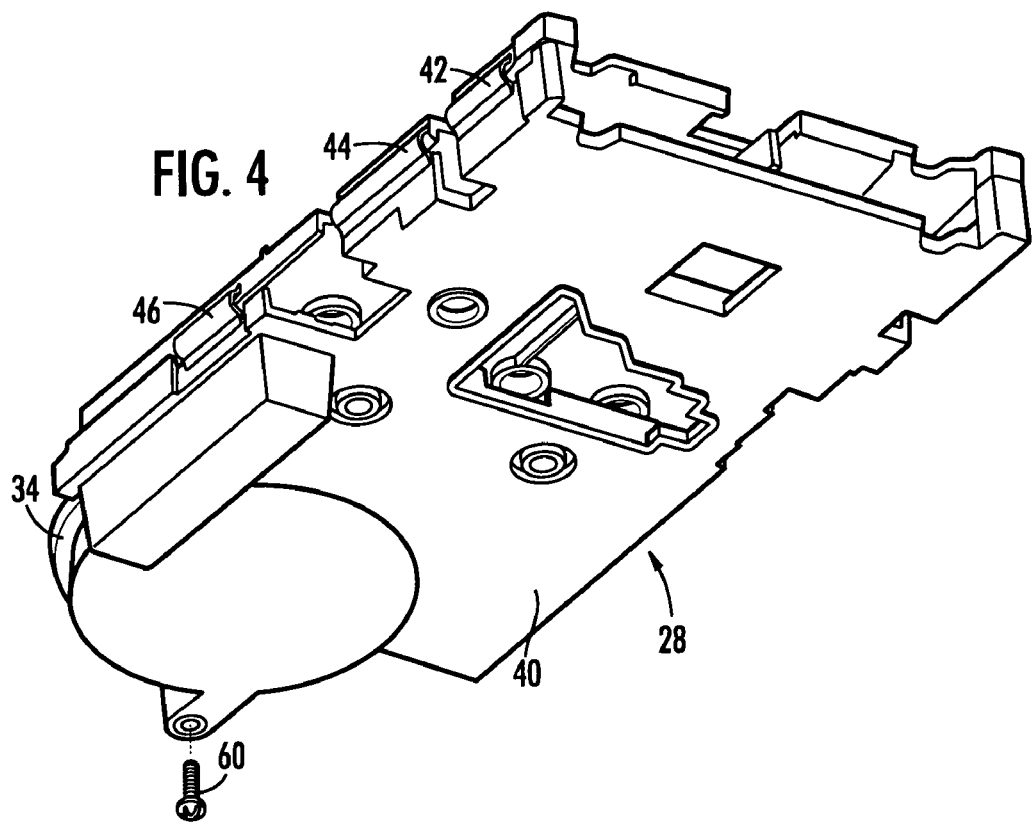
FIG. 4 is a perspective view of the shield arrangement depicted in FIG. 3 in a closed configuration.
Figure 5:
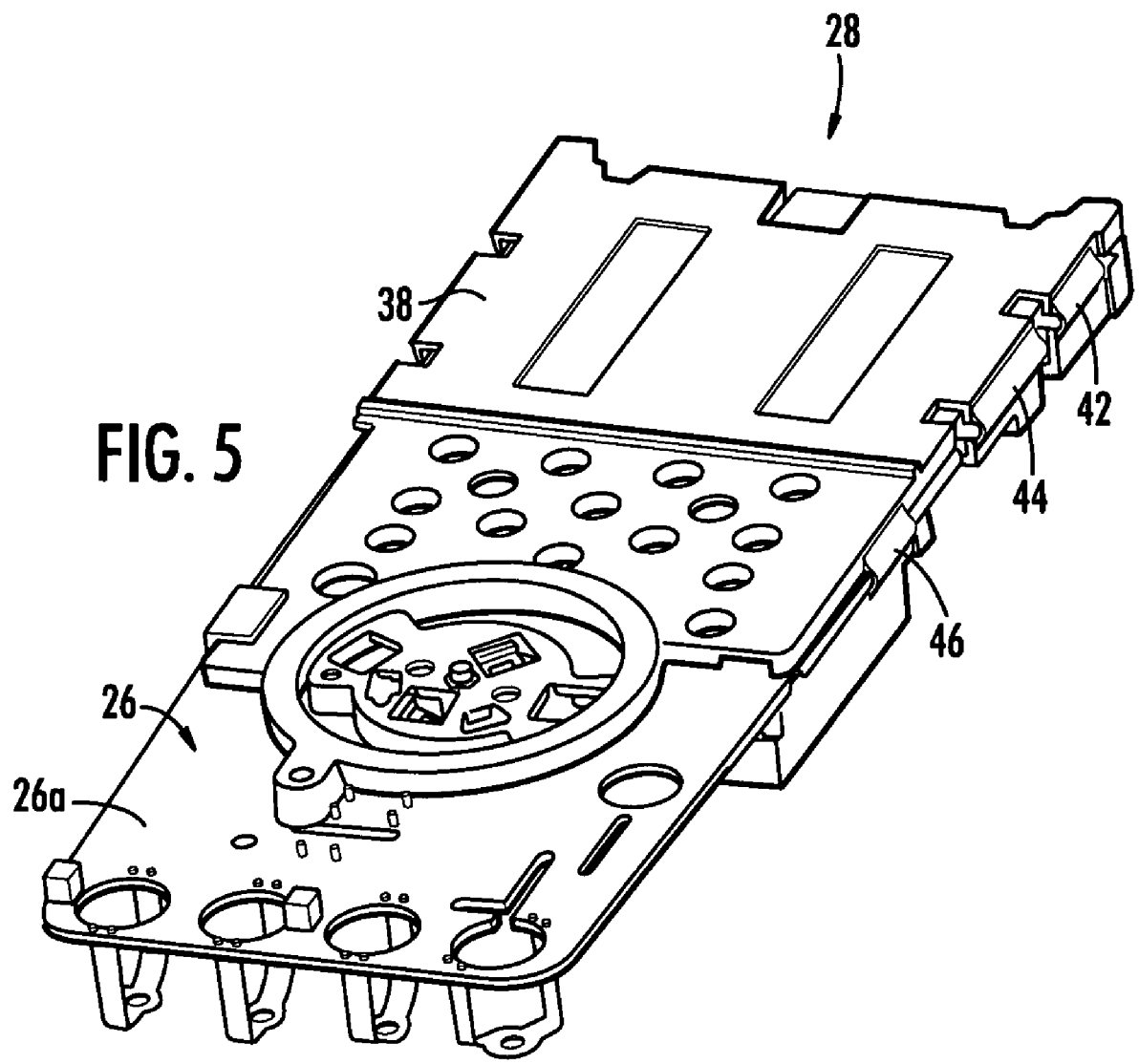
FIG. 5 is a perspective view showing the shield arrangement closed on the printed circuit board to form a subassembly.

Referring now to FIGS. 2-5, the construction of shield arrangement 28 may be most easily explained. As can be seen, shield arrangement 28 includes a top shield part 38 and a bottom shield part 40 interconnected by a plurality of hinges 42, 44 and 46. Hinges 42, 44 and 46 permit shield parts 38 and 40 to be moved between an open configuration (FIG. 3) and a closed configuration (FIG. 4).

Figure 6:
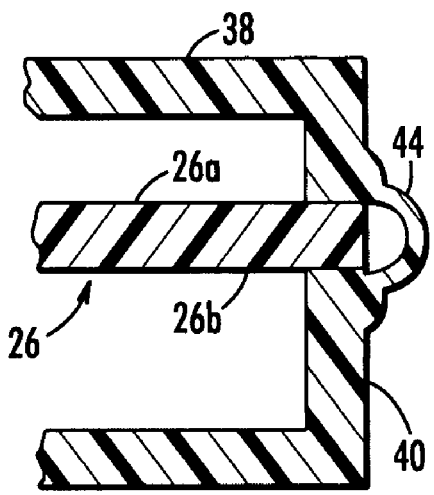
FIG. 6 is an enlarged cross-sectional view showing a living hinge used in a preferred embodiment of the shield arrangement.

Preferably, hinges 42, 44 and 46 are "living" hinges resulting from unitary formation of a connecting structure along with shield parts 38 and 40. In order to provide the desired shielding qualities, the material from which the shield parts and interconnecting structure is formed is preferably a suitable conductive plastic, such as a conductive plastic having carbon fibers molded in resin. Such materials are known to those skilled in the art. When shield parts 38 and 40 are moved into the closed configuration, the connecting structure flexes to allow the desired closure. This is most clearly shown in FIG. 6.

Preferably, shield arrangement 28 includes one or more aligning features to ensure proper closure. In the illustrated embodiment, for example, shield part 38 has a pin 48 that is received in a corresponding hole defined in boss 50. Similarly, shield part 40 has a pin 52 received in a corresponding hole defined in boss 54.

During assembly, shield arrangement 28, in the open configuration, may be located proximate to circuit board 26. (One skilled in the art will appreciate that shield arrangement 28 need only be open enough to allow it to be moved into position with respect to circuit board 26.) Shield parts 38 and 40 are then pivoted into the closed configuration around circuit board 26. As a result, top shield part 38 will be adjacent top side 26a of circuit board 26. Similarly, bottom shield part 40 will be adjacent bottom side 26b of circuit board 26.

Shield parts 38 and 40 may be configured to cover all, or less than all, of the respective circuit board sides depending on the arrangement of electronic devices (including passive electronic components) on the circuit board. In the illustrated embodiments, for example, certain areas of the circuit board are left uncovered. In addition, shield parts 38 and 40 may define various openings that allow access to selected portions of the circuit board. For example, a plurality of holes are provided in top shield part 38 corresponding to various keys on the front surface of the case.

Preferably, shield arrangement 28 will be secured to circuit board 26 so as to form a subassembly that facilitates the manufacturing process. In this embodiment, for example, top shield part 38 and bottom shield part 40 each include a respective protuberance 56 and 58 that align in the closed configuration. Protuberances 56 and 58 are adapted to receive a threaded fastener 60 that extends through a corresponding hole defined in circuit board 26.

Figure 8:
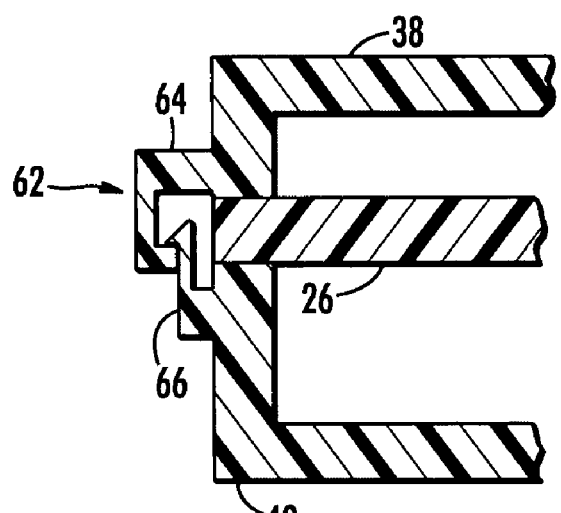
FIG. 8 is an enlarged cross sectional view showing a latch of a shield arrangement in accordance with an alternative embodiment.

In addition, or in the alternative, shield arrangement 26 may be formed having a suitable latch located on the lateral side distal to the hinges. FIG. 8 illustrates a latch 62 that can be utilized for this purpose. As shown, the interlocking elements 64 and 66 of latch 62 may be formed as unitary extensions of top shield part 38 and bottom shield part 40, respectively.

The entire subassembly may then be attached to the multimeter case. In this embodiment, for example, holes 70a-b in top shield part 38 align with corresponding bosses 72a-b in bottom shield part 40. These, in turn, align with holes 74a-b defined in circuit board 26. As a result, threaded fasteners inserted through holes 76a-b in bottom case member 12b (FIG. 2) will extend up through bosses 72a-b, holes 74a-b, and holes 70a-b into corresponding bosses depending from the underside of top case member 12a. Preferably, holes 76a-b may be located in the battery compartment of bottom case member 12b such that the heads of the fasteners will be hidden by the batteries and/or battery cover during use.

Figure 7:
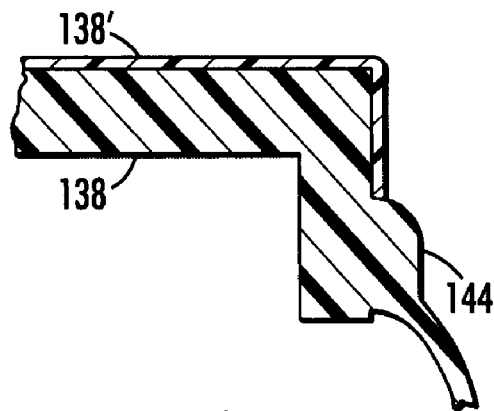
FIG. 7 is an enlarged cross sectional view of a portion of a shield arrangement in accordance with an alternative embodiment.

In an alternative embodiment, a nonconductive plastic may be utilized to form the living hinges, as well as a supporting substrate for the top and bottom shield parts. This is illustrated in FIG. 7, wherein a top shield part 138 is unitarily formed with a living hinge 144 of a nonconductive polymer, such as a PC/ABS blended plastic. A conductive coating 138' is applied over a surface of top shield part 138 in order to provide the desired shielding properties. Although not shown in FIG. 7, one skilled in the art will appreciate that the bottom shield part would be similarly constructed.

It can thus be seen that the present invention provides a digital multimeter having a novel shield arrangement. The shield arrangement simplifies assembly of the multimeter because the shield is not provided in separate parts as has been the case in the past. Alignment of the shield itself in relation to the circuit board is also facilitated. In addition, the entire subassembly can be easily tested and/or calibrated with the shield in place prior to final assembly.

While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A multimeter comprising: a case having a user interface and a display, said case defining an interior cavity; a circuit board located in said interior cavity of said case, said circuit board having a top side and a bottom side; a shield arrangement located in said interior cavity of said case, said shield arrangement configured to cover at least a portion of said top side and said bottom side of said circuit board so as to reduce effects of interference on operation of said multimeter; said shield arrangement including a top shield part adjacent to said top side of said circuit board and a bottom shield part adjacent to said bottom side of said circuit board; and said shield arrangement further including a connecting structure by which said top shield part is interconnected with said bottom shield part; wherein said connecting structure forms at least one hinge configured such that said top shield part and said bottom shield part can be moved between open and closed configurations.

2. A multimeter as set forth in claim 1, wherein said at least one hinge is a living hinge.

3. A multimeter as set forth in claim 2, wherein said top shield part, said bottom shield part and said living hinge are unitarily formed of a conductive polymeric material.

4. A multimeter as set forth in claim 2, wherein said top shield part and said bottom shield part comprise a substrate of nonconductive polymeric material having a conductive coating thereon.

5. A multimeter as set forth in claim 4, wherein said living hinge is unitarily formed of said nonconductive polymeric material along with the substrate of the top shield part and the bottom shield part.

6. A multimeter as set forth in claim 1, wherein said shield arrangement includes at least one aligning feature to facilitate alignment of said top shield part and said bottom shield part in said closed configuration.

7. A multimeter as set forth in claim 6, wherein said aligning feature comprises a pin and hole combination.

8. A multimeter as set forth in claim 1, wherein said shield arrangement includes a latch securing said shield arrangement in said closed configuration.

9. A multimeter as set forth in claim 1, wherein said at least one hinge comprises a plurality of hinges.

10. A multimeter as set forth in claim 1, further comprising a fastener extending through said circuit board to secure said top shield part, said bottom shield part and said circuit board in position with respect to each other.

11. A subassembly for use in an electronic device, said subassembly comprising:
a generally planar circuit board having a plurality of electronic devices mounted thereon, said circuit board having a top side on which a rotary switch member is located and a bottom side;
a shield arrangement configured to cover at least a portion of said top side and said bottom side of said circuit board;
said shield arrangement including a top shield part adjacent to said top side of said circuit board and a bottom shield part adjacent to said bottom side of said circuit board, said top shield part configured to allow connection between a selector knob and said rotary switch member;
said shield arrangement including at least one hinge pivotally interconnecting said top shield part and said bottom shield part; and
means for securing said shield arrangement in a closed configuration fixed to said circuit board.

12. A subassembly as set forth in claim 11, wherein said at least one hinge is a living hinge.

13. A subassembly as set forth in claim 12, wherein said top shield part, said bottom shield part and said living hinge are unitarily formed of a conductive polymeric material.

14. A subassembly as set forth in claim 13, wherein said top shield part and said bottom shield part comprise a substrate of nonconductive polymeric material having a conductive coating thereon.

15. A subassembly as set forth in claim 14, wherein said living hinge is unitarily formed of said nonconductive polymeric material along with the substrate of the top shield part and the bottom shield part.

16. A subassembly as set forth in claim 11, wherein said shield arrangement includes at least one aligning feature to facilitate alignment of said top shield part and said bottom shield part in said closed configuration.

17. A subassembly as set forth in claim 11, wherein said means for securing comprises a threaded fastener.

18. A subassembly as set forth in claim 17, wherein said threaded fastener extends through said circuit board to secure said top shield part, said bottom shield part and said circuit board in position with respect to each other.

19. A subassembly as set forth in claim 11, wherein said means for securing comprises a latch located distal from said hinge.

20. A subassembly as set forth in claim 11, wherein said at least one hinge comprises a plurality of hinges.

21. A method of assembling components of a digital multimeter comprising steps of:
   (a) providing:
      (i) a generally planar circuit board having a plurality of electronic devices mounted thereon, said circuit board having a top side and a bottom side; and
      (ii) a shield arrangement including a top shield part and a bottom shield part pivotally interconnected with each other via a hinge so as to be movable between an open configuration and a closed configuration;
   (b) with said shield arrangement in said open configuration, positioning one of said top shield part and said bottom shield part adjacent to a corresponding one of said top side and said bottom side of said circuit board;
   (c) pivoting said shield arrangement to be in said closed position such that another of said top shield part and said bottom shield part will be adjacent to a corresponding one of said top side and said bottom side of said circuit board; and
   (d) securing said shield arrangement to form a subassembly in which said top shield part, said bottom shield part and said circuit board are maintained in position with respect to each other;
   (e) providing a multimeter case having a top case portion and a bottom case portion defining an interior cavity when joined together; and
   (f) placing said subassembly in the interior cavity of said multimeter case.

22. A multimeter comprising:
   a case having a selector knob for selecting a multimeter function;
   a display;
   a circuit board located in said case;
   a shield arrangement configured to cover at least a portion of said circuit board;
   said shield arrangement including a top shield part and a bottom shield part; and
   said shield arrangement including at least one hinge pivotally interconnecting said top shield part and said bottom shield part.

23. A multimeter as set forth in claim 22, wherein said top shield part, said bottom shield part and said hinge are unitarily formed of a polymeric material.

24. A multimeter as set forth in claim 23, wherein said polymeric material is a conductive polymeric material.

* * * * *